(12) United States Patent
Ling

(10) Patent No.: US 9,615,477 B2
(45) Date of Patent: Apr. 4, 2017

(54) CONNECTING DEVICE, FLAT PANEL DEVICE, IMAGE SENSOR, DISPLAY AND TOUCH APPARATUS

(71) Applicant: Shanghai Tianma Micro-Electronics Co., Ltd., Shanghai (CN)

(72) Inventor: Yan Ling, Shanghai (CN)

(73) Assignee: SHANGHAI TIANMA MICRO-ELECTRONICS CO., LTD., Shanghai (CN)

( * ) Notice: Subject to any disclaimer, the term of this patent is extended or adjusted under 35 U.S.C. 154(b) by 134 days.

(21) Appl. No.: 13/958,414

(22) Filed: Aug. 2, 2013

(65) Prior Publication Data
US 2013/0314883 A1 Nov. 28, 2013

Related U.S. Application Data

(63) Continuation of application No. PCT/CN2012/086037, filed on Dec. 6, 2012.

(30) Foreign Application Priority Data

Apr. 13, 2012 (CN) .......................... 2012 1 0109807

(51) Int. Cl.
*H05K 1/14* (2006.01)
*H05K 7/02* (2006.01)
(Continued)

(52) U.S. Cl.
CPC .............. *H05K 7/026* (2013.01); *H05K 1/189* (2013.01); *H05K 3/361* (2013.01);
(Continued)

(58) Field of Classification Search
CPC ..... H05K 1/14; H05K 1/141; H05K 2201/058
See application file for complete search history.

(56) References Cited

U.S. PATENT DOCUMENTS 5,130,833 A 7/1992 Mase
5,258,866 A * 11/1993 Ishikawa ............. G02F 1/13452
349/150
(Continued)

FOREIGN PATENT DOCUMENTS

CN 1108859 A 9/1995
CN 1591841 A 3/2005
(Continued)

OTHER PUBLICATIONS

Machine Translation of Applicant cited JP2004-087940, Mar. 18, 2004, Ashida et al.*

(Continued)

*Primary Examiner* — Nathan Milakovich
(74) *Attorney, Agent, or Firm* — Alston & Bird LLP

(57) ABSTRACT

A connecting device for connecting a substrate unit and a chip unit includes a first flexible connection unit having at least one first wire extending from a first end to a second end on a surface of the substrate unit, and a rigid connection unit having at least one second conductive wire for electrically connecting to the first conductive wire. The chip unit is sequentially and electrically connected to the substrate unit first via the rigid connection unit and then via the flexible connection unit.

2 Claims, 11 Drawing Sheets

(51) Int. Cl.
*H05K 1/18* (2006.01)
*H05K 3/36* (2006.01)
*H05K 3/32* (2006.01)
*G02F 1/1345* (2006.01)

(52) U.S. Cl.
CPC ......... *G02F 1/13452* (2013.01); *H05K 3/323* (2013.01); *H05K 2201/10128* (2013.01); *H05K 2201/10136* (2013.01); *Y10T 29/49117* (2015.01)

(56) References Cited

U.S. PATENT DOCUMENTS

| | | | |
|---|---|---|---|
| 6,407,795 B1* | 6/2002 | Kamizono | G02F 1/13452 349/149 |
| 7,683,496 B2* | 3/2010 | Lee et al. | 257/797 |
| 7,690,104 B2* | 4/2010 | Rosenblatt et al. | 29/830 |
| 7,738,069 B2* | 6/2010 | Yanagawa et al. | 349/156 |
| 8,023,282 B2* | 9/2011 | Yang | 361/790 |
| 8,101,869 B2* | 1/2012 | Kurasawa | 174/260 |
| 8,823,184 B2* | 9/2014 | Ng et al. | 257/783 |
| 8,946,561 B2* | 2/2015 | Wurzel et al. | 174/254 |
| 9,001,054 B2* | 4/2015 | Abe | G02F 1/133308 178/18.03 |
| 2002/0140654 A1 | 10/2002 | Kim et al. | |
| 2004/0251420 A1 | 12/2004 | Sun | |
| 2005/0088830 A1 | 4/2005 | Yumoto et al. | |
| 2006/0176254 A1 | 8/2006 | Lee et al. | |
| 2007/0030435 A1 | 2/2007 | Cheng et al. | |
| 2007/0134473 A1 | 6/2007 | Kim | |
| 2009/0075025 A1* | 3/2009 | Ozono et al. | 428/120 |
| 2009/0175019 A1* | 7/2009 | Koyama et al. | 361/803 |
| 2010/0220072 A1* | 9/2010 | Chien et al. | 345/173 |
| 2011/0315536 A1* | 12/2011 | Chiou | G06F 3/043 200/600 |
| 2013/0141881 A1 | 6/2013 | Nobori | |
| 2014/0085281 A1* | 3/2014 | Lim | 345/206 |
| 2014/0116147 A1* | 5/2014 | Endo | 73/658 |
| 2016/0050745 A1* | 2/2016 | Liu | H05K 1/118 361/749 |

FOREIGN PATENT DOCUMENTS

| | | |
|---|---|---|
| CN | 1640216 A | 7/2005 |
| CN | 1818747 A | 8/2006 |
| CN | 1984524 A | 6/2007 |
| CN | 101097693 A | 1/2008 |
| EP | 1085788 A2 | 3/2001 |
| JP | H05188389 A | 7/1993 |
| JP | 10123489 A * | 5/1998 |
| JP | 2004087940 A | 3/2004 |
| WO | 2011161857 A1 | 12/2011 |

OTHER PUBLICATIONS

Extended Search Report as received in corresponding European Application No. 12866399.4, dated Jan. 27, 2016.

\* cited by examiner

CONNECTING DEVICE, FLAT PANEL DEVICE, IMAGE SENSOR, DISPLAY AND TOUCH APPARATUS

CROSS-REFERENCES TO RELATED APPLICATIONS

This application claims priority to and is a continuation of International Application No. PCT/CN2012/086037, entitled "CONNECTING DEVICE, FLAT PANEL DEVICE, IMAGE SENSOR, DISPLAY AND TOUCH APPARATUS", filed on Dec. 6, 2012, which claims priority to Chinese patent application No. 201210109807.X, entitled "CONNECTING DEVICE, FLAT PANEL DEVICE, IMAGE SENSOR, DISPLAY AND TOUCH APPARATUS," filed with the State Intellectual Property Office on Apr. 13, 2012, the contents of which are incorporated herein by reference in their entirety.

FIELD OF THE INVENTION

The present invention relates to electronic technologies, and in particular to a connecting device, a flat panel device, an image sensor, a display and a touch apparatus.

BACKGROUND OF THE INVENTION

An X-ray flat panel detector is a part of a large-area planar X-ray imaging system. X-ray radiation passing through an irradiated object is converted into an electronic signal by the X-ray flat panel detector, and then a digitized gray scale image directly relating to the internal structure of an irradiated object is formed. By using the X-ray flat panel detector, a non-destructive internal imaging of the object can be realized, which is one preferable way to realize a non-destructive inspection. The X-ray flat panel detectors have wide applications in medical and technology, and great progress has been made in the fields of medical imaging examination, industrial nondestructive imaging detection and inspection, and the like.

As illustrated in FIG. 1, the X-ray flat panel detector includes an X-ray fluorescent layer 1, a flat panel sensor 2, image acquisition chips 3 and a peripheral logic control and image processing system 4. Specifically, an image acquisition chip 3 includes a switch control chip 31 and a signal read-out chip 32. The flat panel sensor 2 used in the X-ray flat panel detector illustrated in FIG. 1 is an indirect flat panel sensor which only absorbs visible light and light with wavelength close to that of the visible light. Thus, the X-ray fluorescent layer 1 needs to convert the X-ray into the visible light such as green light or blue light. In another X-ray flat panel detector, the flat panel sensor 2 used is a direct flat panel sensor, which can absorb X-rays directly and in this case, the X-ray fluorescent layer 1 may not be needed.

The flat panel sensor 2 includes a large pixel array and a transparent substrate. The pixel array is one of the core components in the X-ray flat panel detector and is disposed on the transparent substrate (e.g., a glass substrate, a quartz substrate). The pixel array includes a plurality of control lines 22 extending along the X axis direction and a plurality of read lines 23 extending along the Y axis direction, the X axis and the Y axis are substantially orthogonal to each other. The region surrounded by two adjacent control lines 22 and two adjacent read lines 23 forms a pixel region, in which a pixel unit is disposed. Each pixel unit 21 includes a photosensor 211 (e.g., a photodiode) and at least one switching element 212 (e.g., a thin film transistor, TFT). The state of switching element 212 is controlled by a control signal on the control line 22. When switching element 212 is turned on, the signal in the pixel unit 21 which in the same pixel region as switching element 212 can be read by the read line 23. When the switching element 212 is turned off, the signal in the pixel unit 21, which is in the same pixel region as the switching element 212, cannot be read by the read line 23. Specifically, in a case where the switching element 212 is a TFT, for example, the TFT is disposed at the intersection between one control line 22 and one read line 23, and the pixel unit 21, which is in the same pixel region as the TFT, is coupled to the control line 22 and the read line 23 via the TFT. The coupling means that a gate electrode of the TFT is electrically connected to the control line 22, a source electrode/drain electrode of the TFT is electrically connected to the read line 23, and a drain electrode/source electrode of the TFT is electrically connected to the pixel unit 21. The size and number of the pixel units 21 may affect the resolution and the area of the image.

X-rays passing through the object under detection can be converted into visible light by the X-ray fluorescent layer 1, and the visible light is projected onto (or the X-rays passing through the irradiated object are directly projected onto) the photosensors 211 of the flat panel sensor 2. The photosensors 211 generate electric charges in a corresponding proportion and temporarily store them in the pixel units 21 of the flat panel sensor 2. When a control signal is applied to one control line 22 and the switching element TFT 212 of which the gate electrode is electrically connected to the control line 22 is turned on, the electric charge signal temporarily stored in the photosensor 211 can be read out by the read line 23 which is electrically connected to the source/drain electrode of the switching element TFT 212. An analog-to-digital conversion or another corresponding processing is then performed on the electric charge signal.

The peripheral logic control and image processing system 4 controls the image acquisition chips 3 to function properly, so as to turn the switching element TFTs 212 in each row of the pixel units 21 on or off and to read and process the charge signals in the photosensors 211 in respective pixel units 21. The switch control chips 31 sequentially turns on the switching element TFTs 212 line by line via the control lines 22. While the switching element TFTs 212 are turned on, the signal read-out chips 32 read out the charge signals temporarily stored in the pixel units 21 via the read lines 23, perform the analog-to-digital conversion, and transmit the processed digital signals to the peripheral logic control and image processing system 4. In this way, the image acquisition is performed line by line until all of the charge signals in the pixel units 21 of the whole flat panel sensor 2 are read out, so that the complete image is read and processed.

As illustrated in FIG. 2, in the prior art, the image acquisition chip 3 is mounted on a flexible printed circuit board (FPC) 5 by a chip on film (COF) bonding process. The image acquisition chip 3 and the FPC 5 are packaged together and form a COF module 6. Then the COF module 6 is bonded onto a conductive contact 24 of the flat panel sensor 2 by a film on glass (FOG) bonding process, so that the flat panel sensor 2 and the image acquisition chip 3 are electrically connected to each other. In the FOG bonding process, the conductive contact 24 of the flat panel sensor 2 is coated with an anisotropic conductive film (ACF) 7, then the FPC 5 of the COF module 6 is connected to the conductive contact 24 of the flat panel sensor 2 by a hot pressing process. The ACF 7 conducts electricity in one direction only (the vertical direction), but does not conduct electricity in other directions (e.g., the horizontal direction).

Therefore, the COF module 6 is in conductive connection with the conductive contact 24, but is electrically isolated from adjacent conductive contact(s). Of course, in the conventional art, the COF module 6 may also be metal-welded to the conductive contact 24 of the flat panel sensor 2, so that the flat panel sensor 2 and the image acquisition chip 3 are electrically and physically connected to each other.

In normal mode of operation or test mode of operation, if the flat panel sensor 2 has a problem and does not meet performance requirements, and the COF module 6 has to be removed from the flat panel sensor 2. The FPC 5 in the COF module 6 may be damaged in the removal process due to the sticking and hot pressing process or the metal-welding process of the ACF 7 and the flexible feature of the FPC 5, resulting in a non-operation of the entire COF module 6. However, the image acquisition chip 3 in the COF module, although not damaged, cannot be recovered and reused (i.e., recycled) due to damage of the FPC 5, leading to waste of otherwise good image acquisition chips.

Worse yet, not only in the case of the X-ray flat panel detector, the image acquisition chip 3 cannot be recycled, leading to resources waste, as described above, but also in the case of other devices (e.g., touch screens, flat panel displays) where the chip unit and the flexible connecting device are packaged in a COF module which is then connected to the substrate unit of the device by ACF bonding or metal-welding, the image acquisition chips cannot be recovered and reused due to damage of the flexible connecting device in the COF module during the removal process, resulting in enormous waste of otherwise reusable chips.

BRIEF SUMMARY OF THE INVENTION

Embodiments of the present invention provide a connecting device for connecting a substrate unit and a chip unit to eliminate waste of reusable chips during a removal process. The connecting device includes a first flexible connection unit having a first wire for electrically connecting to the substrate unit, and a rigid connection unit connected to the first flexible connection unit and including a second wire for connecting to the first wire. The chip unit is electrically connected to the second wire.

Embodiments of the present invention also provide a flat panel device including a substrate unit, a first flexible connection unit, a rigid connection unit and a chip unit. In an embodiment, the first flexible connection unit includes a first wire that is electrically connected to the substrate unit. The rigid connection unit is connected to the first flexible connection unit and includes a second wire electrically connected to the first wire, and the chip unit is electrically connected to the substrate unit via the second wire and the first wire in sequence.

Embodiments of the present invention also provide a flat panel image sensor. The flat panel image sensor includes a flat panel device having a substrate unit, a flexible connection unit, a rigid connection unit and a chip unit. In an embodiment, the substrate unit includes a TFT array substrate having a plurality of pixel regions defined thereon and a plurality of photosensitive sensors disposed therein.

Embodiments of the present invention also provide an organic light-emitting diode display including the flat panel device having a substrate unit as described above. In an embodiment, the substrate unit includes a TFT array substrate having a plurality of the pixel regions having a plurality of organic light-emitting diodes disposed therein.

Embodiments of the present invention also provide a liquid crystal display. The liquid crystal display includes a color film substrate, a liquid crystal layer, and the flat panel device having a substrate unit. In an embodiment, the substrate unit includes a TFT array substrate having a plurality of pixel regions. A plurality of pixel electrodes are disposed in each of the pixel regions of the TFT array substrate. The color film substrate and the TFT array substrate are disposed opposite to each other, with the liquid crystal layer filling between the color film substrate and the TFT array substrate.

Embodiments of the present invention also provide an electronic paper display. The electronic paper display includes an upper substrate, a microcapsule layer and the flat panel device; the substrate unit includes a TFT array substrate; in the region of the TFT array substrate, a plurality of pixel electrodes are disposed. The upper substrate and the TFT array substrate are disposed opposite to each other, with the microcapsule layer filling between the upper substrate and the TFT array substrate.

Embodiments of the present invention also provide a touch apparatus. The touch apparatus includes the flat panel device having a substrate unit, which serves as a touch screen.

BRIEF DESCRIPTION OF THE DRAWINGS

In the following, specific embodiments of the present invention will be described in detail in conjunction with the drawings. It is noted that the drawings illustrate only certain typical embodiments of the present invention and are therefore not to be considered limiting of its scope.

DETAILED DESCRIPTION OF THE INVENTION

Figure 1:
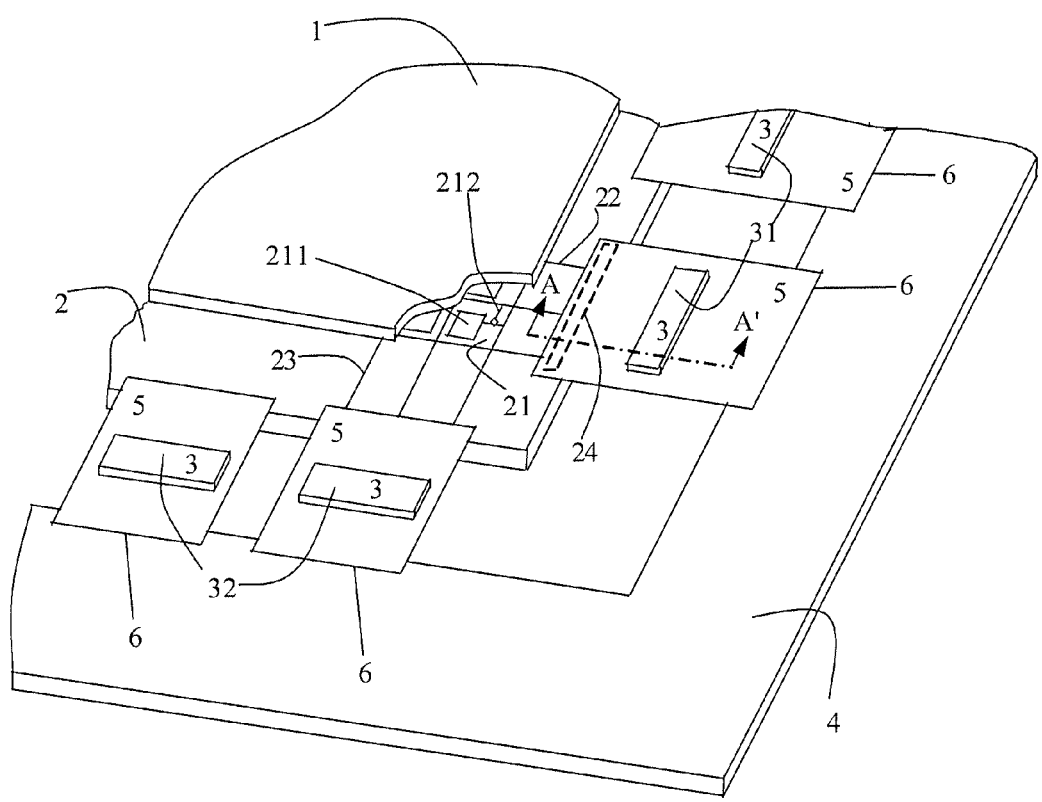
FIG. 1 is a schematic diagram of the three-dimensional structure of a conventional X-ray flat panel detector.
Figure 2:
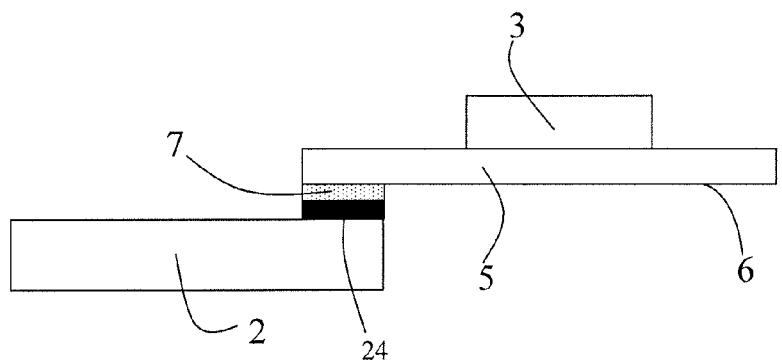
FIG. 2 is a schematic cross-sectional diagram taken along the line A-A' of FIG. 1.

It is noted that ACF bonding technology is well known in the art and will not be described in details herein. In brief overview, the essential feature of the ACF bonding technology is to dispose an ACF (anisotropic conductive film) between the conductive contacts of two units and then to perform a hot pressing so that the conductive contacts of the two units are conductive in the vertical direction but not conductive in the horizontal direction. Thus, such a connection of two units is referred to as "being connected by ACF bonding" herein. For example, the bonding in which the chip is connected to the glass substrate by ACF bonding is referred to as COG bonding; the bonding in which the chip is connected to the FPC by ACF bonding is referred to herein as COF bonding; the bonding in which the chip is connected to the PCB substrate by ACF bonding is referred to herein as COB bonding; the bonding in which the FPC is connected to the glass substrate by ACF bonding is referred to herein as FOG bonding; the bonding in which the FPC is connected to the FPC by ACF bonding is referred to herein as FOF bonding; the bonding in which the FPC is connected to the PCB substrate by ACF bonding is referred to herein as FOB bonding. In addition, the metal-welding technology is also well known in the art and will not be described in details herein. In brief overview, the essential feature of metal-welding is to apply high temperature or ultrasonic wave to conductive contacts of two units while the conductive contacts are pressed together, causing the conductive contacts of the two units to be melted under a heat treatment and fused with each other to form an alloy, so as to achieve both an electrical connection as well as a mechanical connection.

An embodiment of the present invention provides a connecting device for connecting a substrate unit and a chip unit. The connecting device includes a first flexible connection unit having a first wire disposed on its surface and extending from a first end to a second end of the first flexible connection unit. The first wire is configured to electrically connect to the substrate unit. The connecting device also includes a rigid connection unit having a second wire configured to connect to the first flexible connection unit. The chip unit is electrically connected to the second wire. The chip unit may transmit a signal to the substrate unit via the second wire and the first wire in sequence. In the present invention, the term "in sequence," as used herein, refers to a signal provided by the chip unit that passes through the second wire firstly and then passes through the first wire in the transmission path before finally reaching the substrate unit. Thus, the chip unit can be disposed in the rigid connection unit. Alternatively, the chip unit can be connected to an additional unit first and then be in indirect connection with the rigid connection unit by means of the additional unit.

In an embodiment, the first wire can be made of metal or other conductor and can be of one layer or multiple layers. The second wire can be made of metal or other conductor and can be of one layer or multiple layers.

The rigid connection unit can be connected to the first flexible connection unit in a one-to-one way, i.e., one rigid connection unit is connected to one first flexible connection unit. The rigid connection unit may also be connected to several first flexible connection units in a one-to-many way, i.e., one rigid connection unit may be connected to at least two first flexible connection units.

First Embodiment

Figure 3:
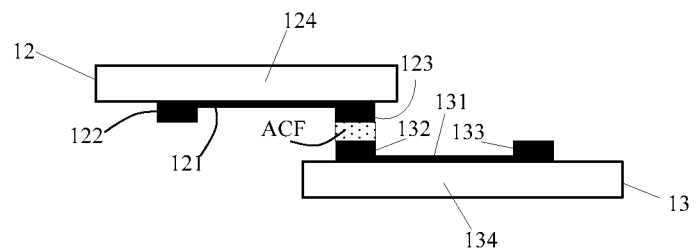
FIG. 3 is a schematic structure diagram of a connecting device according to a first embodiment of the present invention.

As illustrated in FIG. 3, the rigid connection unit 13 can be connected to the first flexible connection unit 12 by ACF bonding. That is, an ACF material is coated between the conductive contact terminal of the rigid connection unit 13 and the conductive contact terminal of the first flexible connection unit 12, and then heat pressing (hot press bonding) is performed, so that the conductive contact terminal of the rigid connection unit 13 and the conductive contact terminal of the first flexible connection unit 12 are pressed together and electrically connected to each other.

In an embodiment, the first wire 121 of the first flexible connection unit 12 includes a first end having a first conductive contact terminal 122 disposed thereon and a second end having a second conductive contact terminal 123 disposed thereon. The second wire 131 of the rigid connection unit 13 includes a third end having a third conductive contact terminal 132 disposed thereon. The first conductive contact terminal 122 is configured to connect to the substrate unit by ACF bonding. The second conductive contact terminal 123 is connected to the third conductive contact terminal 132 by ACF bonding. The first wire 121 connects the corresponding first conductive contact terminal 122 and the second conductive contact terminal 123.

In an embodiment, the first flexible connection unit 12 can be a FPC. The first flexible connection unit 12 may include a flexible substrate 124 having a surface, and the first wire 121, the first conductive contact terminal 122 and the second conductive contact terminal 123 which are disposed on the surface of the flexible substrate 124. The first wire can be made of metal or other conductor and can have one layer or multiple layers. The first wire 121 can be formed either on a same surface of the first flexible substrate 124 or on opposite surfaces of the first flexible substrate 124. The portions of the first wire 121 formed on different layers of the same surface of the first flexible substrate 124 or on the opposite surfaces of the first flexible substrate 124 can be connected via through-substrate via(s) or hole(s).

The rigid connection unit 13 may include a rigid substrate 134. A fourth conductive contact terminal 133 is disposed on the other end of the second wire 131 of the rigid connection unit 13. The second wire 131, the third conductive contact terminal 132 and the fourth conductive contact terminal 133 are disposed on a surface of the rigid substrate 134. The second wire 131 is conductive and electrically connects the third conductive contact terminal 132 and the fourth conductive contact terminal 133. The rigid substrate 134 can be made of glass, quartz, PCB and the like. The second wire can be made of metal or other conductor and can be of one layer or multilayer. The second wire 131 can be made either on a same surface of the rigid substrate 134 or on opposite surfaces of the rigid substrate 134. The portions of the second wire 131 on the different layers of the same surface of the rigid substrate 134 or on the opposite surfaces of the rigid substrate 134 can be connected via through-substrate via(s) or hole(s).

Figure 4:
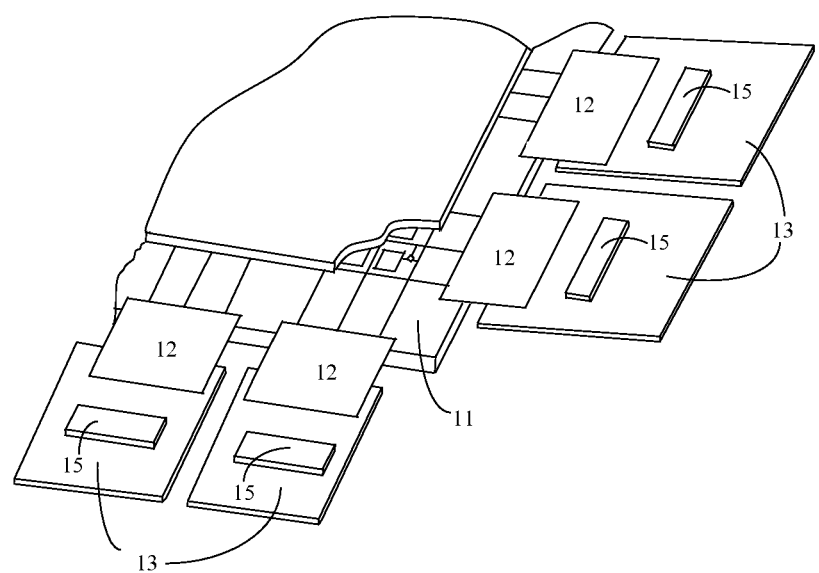
FIGS. 4 and 5 are schematic diagrams of a three-dimensional structure of a flat panel device according to embodiments of the present invention.
Figure 5:
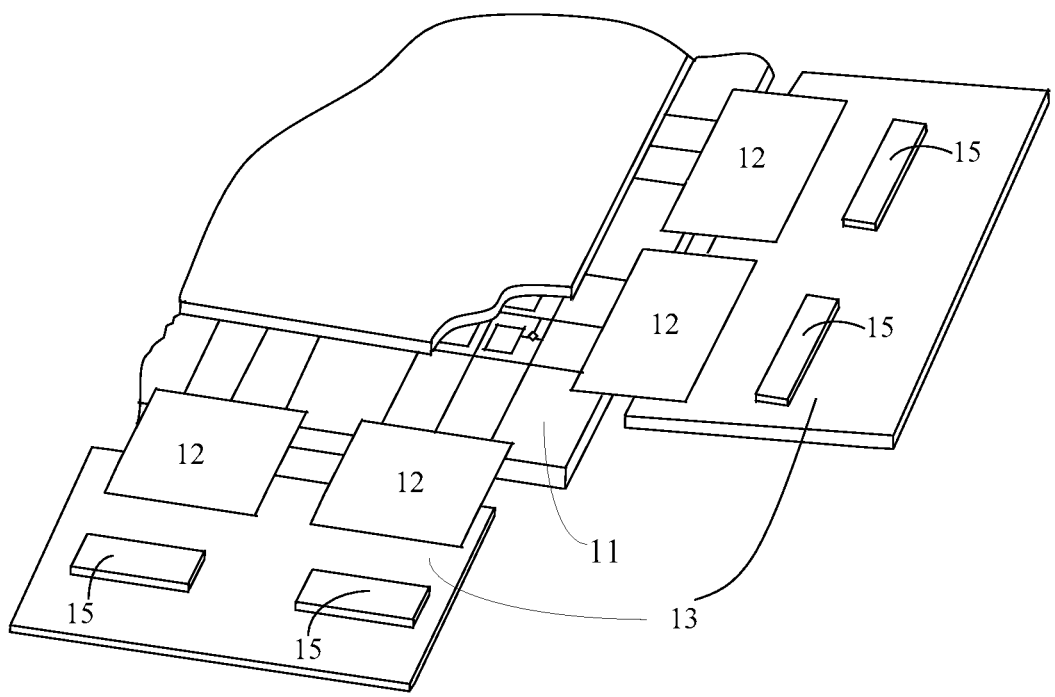

As illustrated in FIG. 4, the one or more rigid connection units 13 can be connected to a plurality of the first flexible connection units 12 in many ways. In an exemplary embodiment, each one of the rigid connection units 13 is connected with one of the first flexible connection units 12 in a one-to-one way, i.e., one rigid connection unit 13 is connected to one first flexible connection unit 12. In the alternative, as illustrated in FIG. 5, each one of the rigid connection units 13 may also be connected to multiple first flexible connection units 12 in a one-to-many way. In an exemplary embodiment, one rigid connection unit 13 may be connected to at least two first flexible connection units 12.

In an embodiment, the fourth conductive contact terminal 133 can be used for connecting to the chip unit by ACF bonding. The fourth conductive contact terminal 133 can also be used for connecting to other devices.

In some embodiments, the "ACF bonding" process can be replaced with a "metal-welding" process.

Second Embodiment

Figure 6:
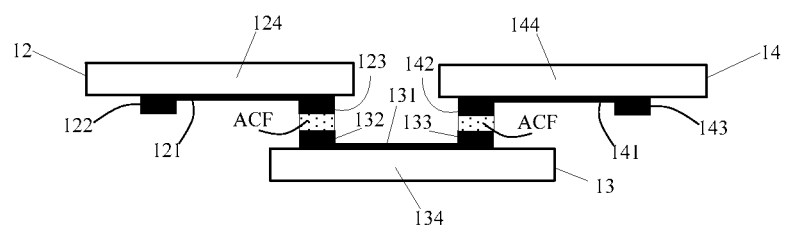
FIG. 6 is a schematic structure diagram of a connecting device according to a second embodiment of the present invention.

As illustrated in FIG. 6, the connecting device further includes a second flexible connection unit 14. The second flexible connection unit 14 includes a fifth conductive contact terminal 142, a sixth conductive contact terminal 143 and a third wire 141 connecting the fifth conductive contact terminal 142 and the sixth conductive contact terminal 143. The fifth conductive contact terminal 142 and the fourth conductive contact terminal 133 are connected by ACF bonding.

The sixth conductive contact terminal 143 can be used for connecting to the chip unit by ACF bonding. The sixth conductive contact terminal 143 may also be used for connecting to other devices.

In an embodiment, the flexible connection unit 14 can be a FPC. The flexible connection unit 14 may include a second flexible substrate 144. The third wire 141, the fifth conductive contact terminal 142, and the sixth conductive contact terminal 143 are on the second flexible substrate 144. The fifth conductive contact terminal 142 and the sixth conductive contact terminal 143 are disposed at the two distal ends of the third wire 141 and are electrically connected to each other by the third wire 141. In an embodiment, the third wire 141 can be made of metal or other conductor and can be of one layer or multiple layers. The third wire 141 can be formed either on a same surface of the second flexible substrate 144 or on opposite surfaces of the second flexible substrate 144. The portions of the third wire 141 on the different layers of the same surface of the second flexible substrate 144 or on the opposite surfaces of the second flexible substrate 144 can be connected via through-substrate via(s) or hole(s).

Figure 7:
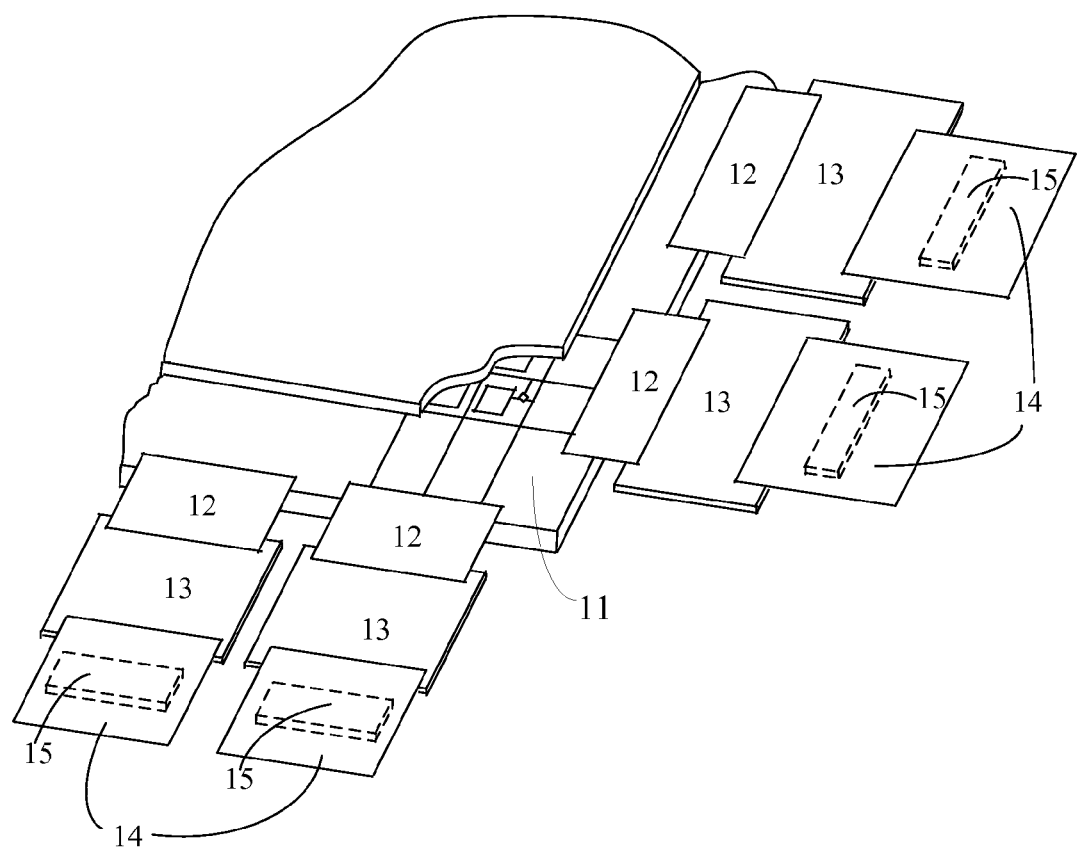
FIGS. 7 and 8 are schematic diagrams of a three-dimensional structure of another flat panel device according to embodiments of the present invention.
Figure 8:
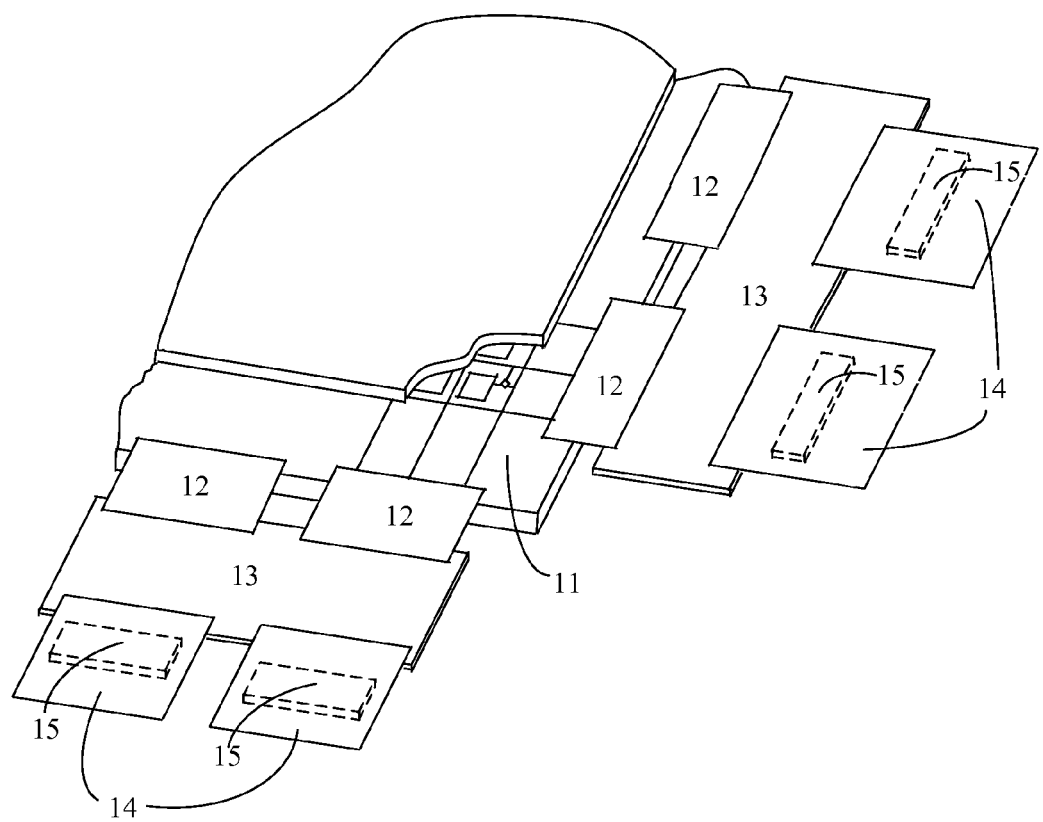

In an embodiment, as illustrated in FIG. 7, the rigid connection unit 13 can be connected to the second flexible connection unit 14 in a one-to-one way, i.e., one rigid connection unit 13 is connected to one second flexible connection unit 14. In another embodiment, as illustrated in FIG. 8, the rigid connection unit 13 can also be connected to the second flexible connection units 14 in a one-to-many way, i.e., one rigid connection unit 13 is connected to at least two second flexible connection units 14.

An embodiment of the present invention provides a flat panel device. The flat panel includes a substrate unit, a first flexible connection unit, a rigid connection unit and a chip unit. The first flexible connection unit is connected to the substrate unit and includes a first wire electrically connected to the substrate unit. The rigid connection unit is connected to the first flexible connection unit and includes a second wire electrically connected to the first wire. The chip unit is electrically connected to the substrate unit via the second wire and the first wire in sequence.

The substrate unit can be connected to the first flexible connection unit by ACF bonding; the first flexible connection unit is connected to the rigid connection unit by ACF bonding. For an X-ray flat panel detector, the chip unit can be either a switch control chip or a signal read-out chip. For the flat panel display (such as LCD, OLED, E-BOOK), the chip unit can be either a scan-driving chip or a data-driving chip; or the chip unit can be either a scan-driving chip or a touch detection chip.

In some embodiments, the "ACF bonding" process can be replaced by a "metal-welding" process.

Third Embodiment

Figure 9:
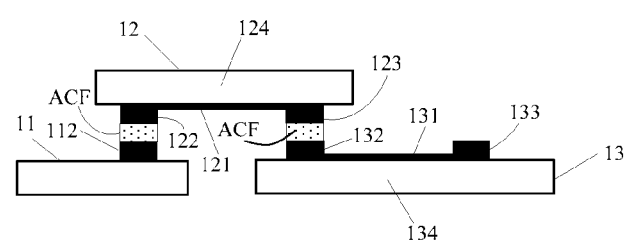
FIGS. 9 and 10 are schematic structure diagrams of a flat panel device according to a third embodiment of the present invention.

As illustrated in FIG. 9, the substrate unit 11 includes a substrate conductive contact terminal 112. The first conductive contact terminal 122 and the second conductive contact terminal 123 each are disposed on the distal ends of the first wire 121 of the first flexible connection unit 12. The third conductive contact terminal 132 and the fourth conductive contact terminal 133 each are disposed on the distal ends of the second wire 131 of the rigid connection unit 13. The substrate conductive contact terminal 112 is connected to the first conductive contact terminal 122 by ACF bonding; and the second conductive contact terminal 123 is connected to the third conductive contact terminal 132 by ACF bonding.

Figure 10:
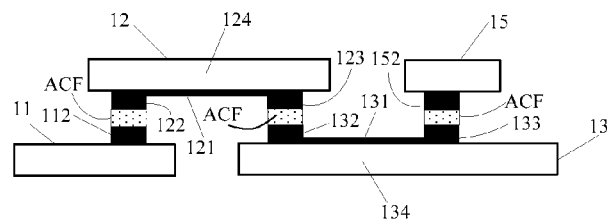

The rigid connection unit can be connected to the chip unit by ACF bonding. As illustrated in FIG. 10, the fourth conductive contact terminal 133 of the rigid connection unit 13 is connected to the chip unit 15 by ACF bonding. In an embodiment, the fourth conductive contact terminal 133 of the rigid connection unit 13 is connected to a chip conductive contact terminal 152 of the chip unit 15 by ACF bonding.

Referring back to FIG. 4, the one or more rigid connection unit 13 can be connected to the plurality of the first flexible connection unit 12 in a one-to-one way, i.e., each one of the rigid connection units 13 is connected to one of the first flexible connection units 12. In an alternative, as shown in FIG. 5, each one of the rigid connection unit 13 can also be connected to the first flexible connection units 12 in a one-to-many way. For example, one of the rigid connection units 13 is connected to at least two first flexible connection units 12.

In some embodiments, the "ACF bonding" process can be replaced with a "metal-welding" process.

Fourth Embodiment

Figure 11:
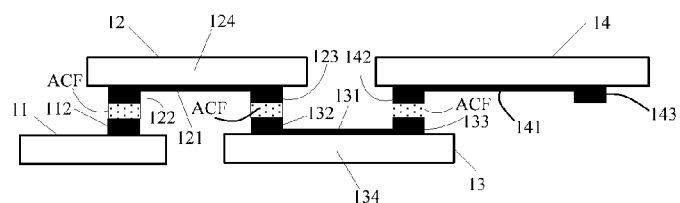
FIGS. 11 and 12 are schematic structure diagrams of a flat panel device according to a fourth embodiment of the present invention.

The flat panel device further includes a second flexible connection unit, and the rigid connection unit can be further connected to the second flexible connection unit by ACF bonding. As illustrated in FIG. 11, the second flexible connection unit 14 includes a third wire 141 having a distal end including a fifth conductive contact terminal 142 disposed thereon and another distal end including a sixth conductive contact terminal 143 disposed thereon. The fourth conductive contact terminal 133 of the rigid connection unit 13 is connected to the fifth conductive contact terminal 142 of the second flexible connection unit 14 by ACF bonding. In an embodiment, the second flexible connection unit is a FPC.

Figure 12:
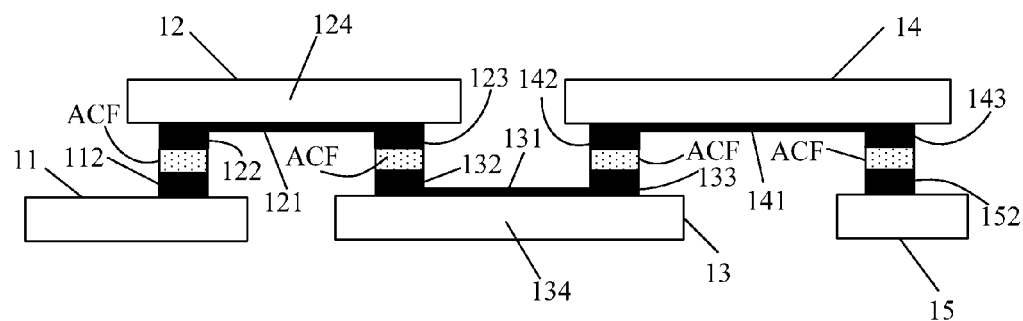

The second flexible connection unit can be connected to the chip unit by ACF bonding. As illustrated in FIG. 12, the sixth conductive contact terminal 143 of the second flexible connection unit 14 is connected to the chip unit 15 by ACF bonding. In an embodiment, the sixth conductive contact terminal 143 of the second flexible connection unit 14 is connected to a chip conductive contact terminal 152 of the chip unit 15 by ACF bonding.

Referring back to FIG. 7, each one of the rigid connection units 13 can be connected to one of the second flexible connection units 14 in a one-to-one way, i.e., one rigid connection unit 13 is connected to one second flexible connection unit 14. In an alternative, as illustrated in FIG. 8, each one of the rigid connection units 13 may also be connected to the second flexible connection units 14 in a one-to-many way, i.e., one rigid connection unit 13 may be connected to at least two second flexible connection units 14.

In some embodiments, the "ACF bonding" process can be replaced with a "metal-welding" process.

Fifth Embodiment

Figure 13:
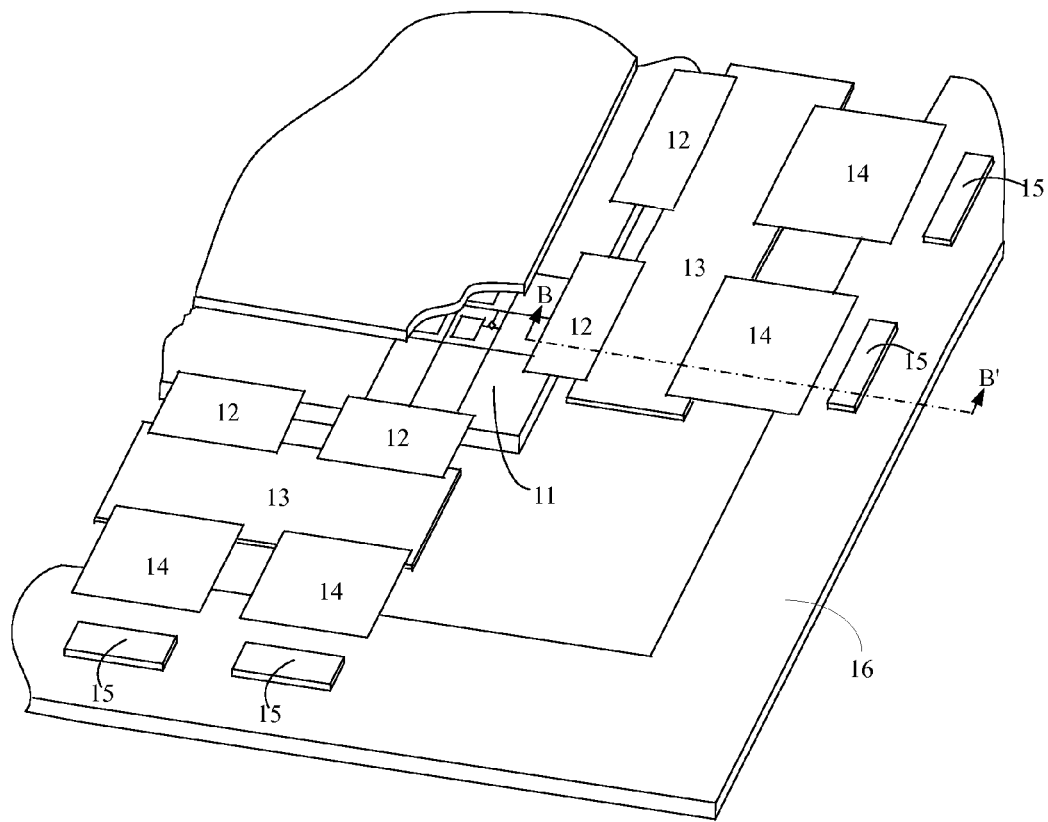
FIG. 13 is a schematic diagram of a three-dimensional structure of a flat panel device according to a fifth embodiment of the present invention.
Figure 14:
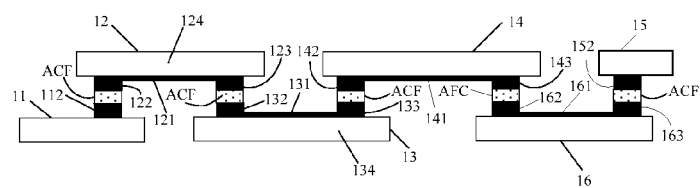
FIG. 14 is a cross-sectional schematic diagram taken along the line B-B' of FIG. 13.

As illustrated in FIG. 13, the flat panel device further includes a PCB 16; the second flexible connection unit 14 is connected to the PCB 16; the PCB 16 is connected to the chip unit 15 by ACF bonding. As illustrated in FIG. 14, the PCB 16 includes a fourth wire 161 on its surface extending from one end to another end of the PCB. Fourth wire 161 includes a seventh conductive contact terminal 162 disposed on the one end and a eighth conductive contact terminal 163 disposed on the another end of the PCB. The sixth conductive contact terminal 143 of the second flexible connection unit 14 is connected to the seventh conductive contact terminal 162 of the PCB by ACF bonding, and the eighth conductive contact terminal 163 of the PCB is connected to a chip conductive contact terminal 152 of the chip unit 15 by ACF bonding. It is understood that the second flexible connection unit 14 can be connected to the PCB 16 by other ways such as by a connector.

In an embodiment, a circuit unit can be disposed on the PCB, the circuit unit may include a peripheral logic control and image processing system.

In some embodiments, the "ACF bonding" process can be replaced with a "metal-welding" process.

Sixth Embodiment

Figure 15:
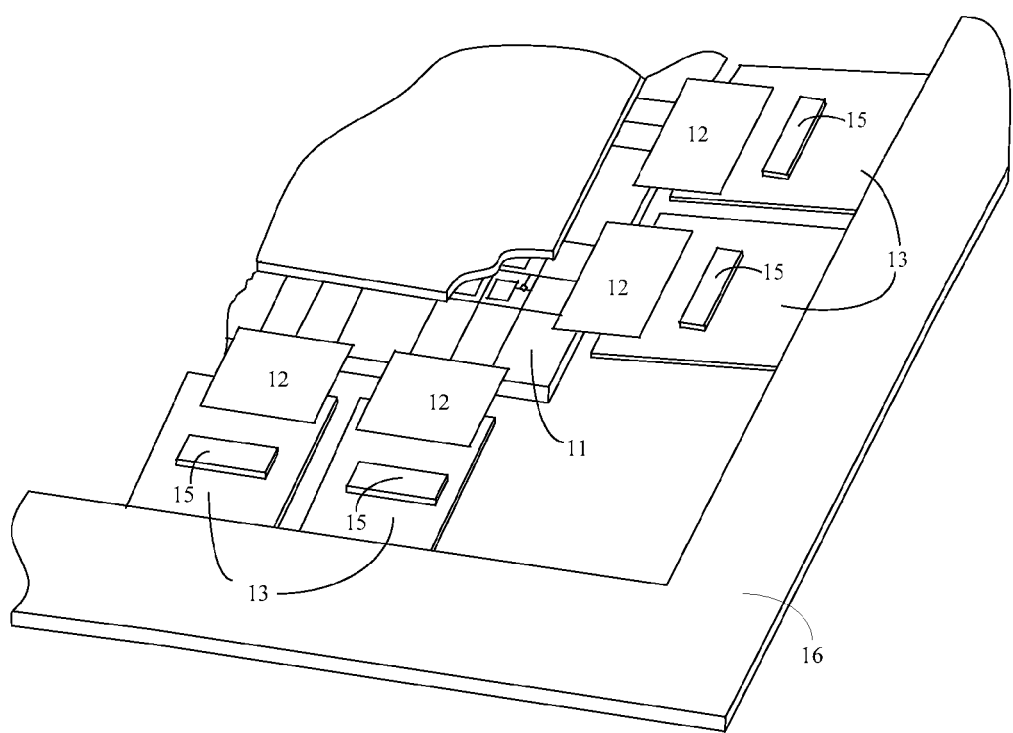
FIGS. 15 and 16 are schematic diagrams of a three-dimensional structure of a flat panel device according to a sixth embodiment of the present invention.
Figure 16:
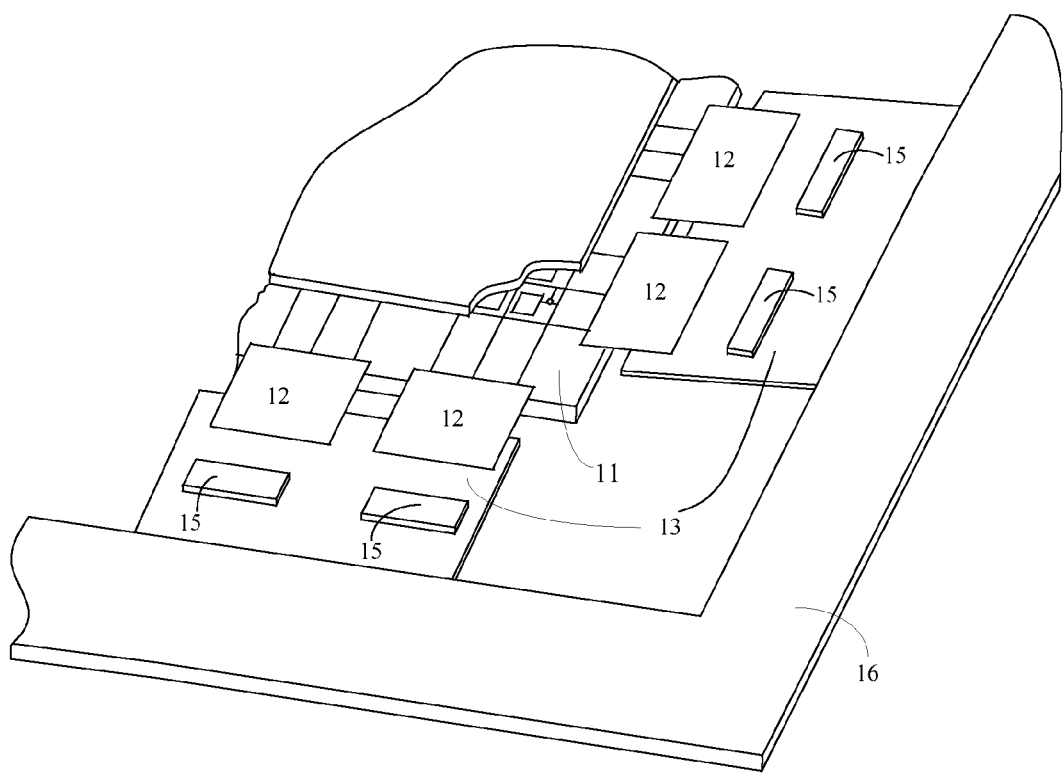

As illustrated in FIGS. 15 and 16, and in connection with the third embodiment, the flat panel device further includes a PCB 16; the PCB 16 is connected to a rigid connection unit 13 and is electrically connected to a chip unit 15 via a second wire 131.

Seventh Embodiment

Figure 17:
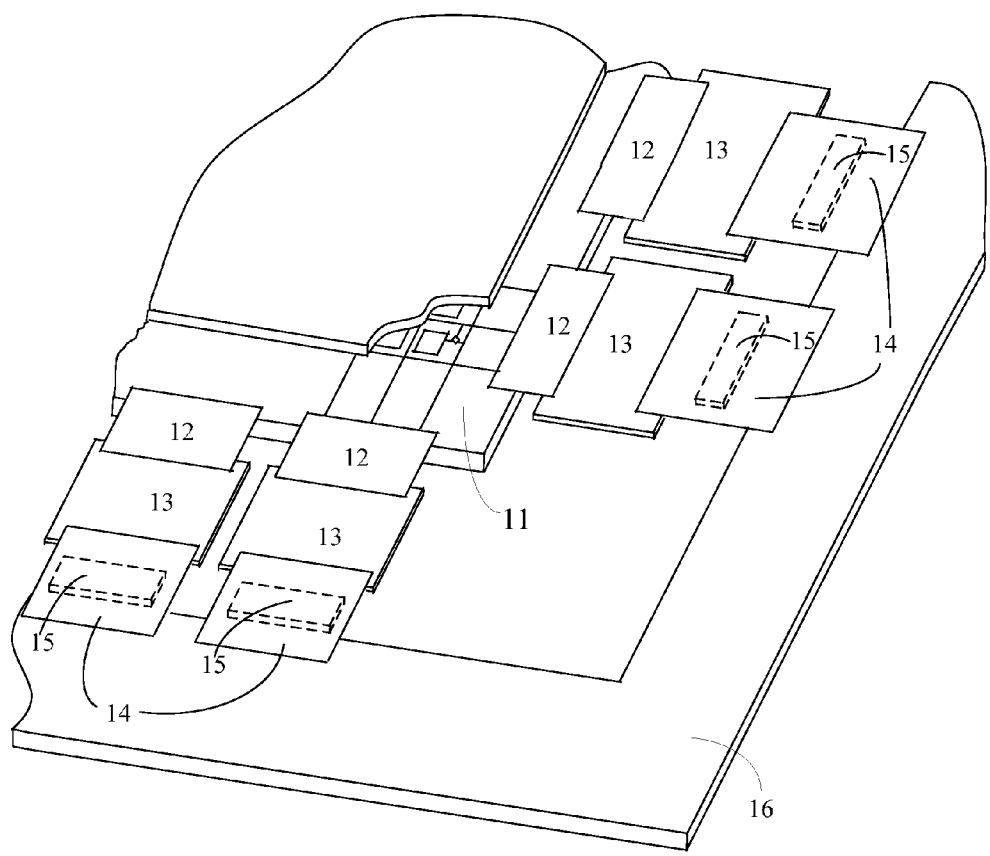
FIGS. 17 and 18 are schematic diagrams of a three-dimensional structure of a flat panel device according to a seventh embodiment of the present invention.
Figure 18:
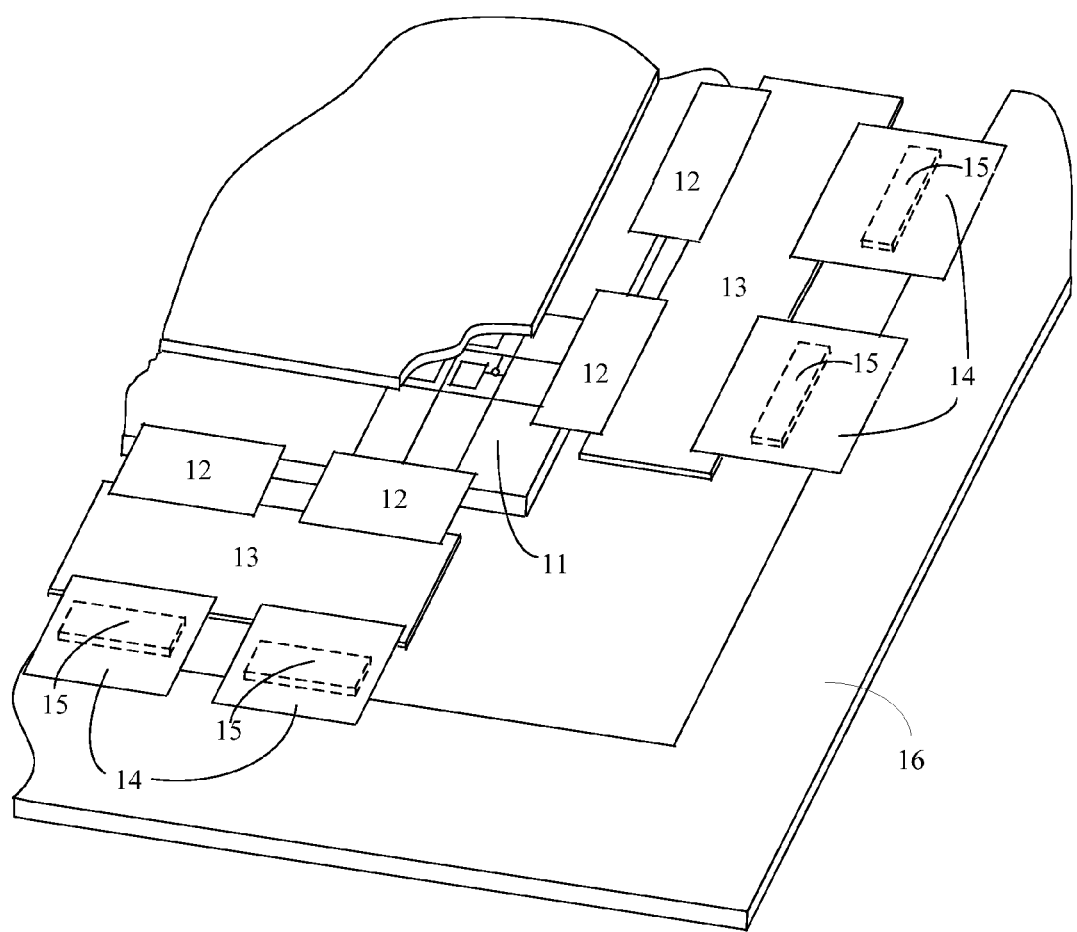

As illustrated in FIGS. 17 and 18, and in connection with the fourth embodiment, the flat panel device further includes a PCB 16; the PCB 16 is connected to a second flexible connection unit 14 and is electrically connected to a chip unit 15 via a third wire 141.

In an embodiment, the substrate unit may include a TFT array substrate. The TFT array substrate can be a TFT array substrate for a flat panel apparatus, for example, a TFT array substrate for a liquid crystal display (LCD), a TFT array substrate for an electronic paper display, a TFT array substrate for an active matrix/organic light emitting diode (AMOLED), and a TFT array substrate for a X-ray flat panel image sensor. The TFT array substrate may include a substrate and a layer of TFT array on the substrate. The layer of TFT array may include a plurality of scanning lines and multiple data lines crossed with each other. The region surrounded by two adjacent scanning lines and two adjacent data lines defines a pixel region. In the pixel region, a plurality of pixel electrodes are disposed. At the intersection of the scanning line and the data line there is disposed a TFT switch. The pixel electrode is coupled to the scanning line and the data line via the TFT switch, i.e., a gate electrode of the TFT is electrically connected to the corresponding scanning line, and a source electrode/drain electrode of the TFT is electrically connected to the corresponding data line, a drain electrode/source electrode of the TFT is electrically connected to the corresponding pixel electrode. For the AMOLED, on the pixel electrodes, the organic light emitting diodes are disposed. For the X-ray flat panel image sensor, on the pixel electrodes, a photosensitive sensor is disposed, which generally is a photosensitive diode.

In another embodiment, the substrate unit can be a touch screen. The touch screen can be a capacitive touch screen, a resistance-type touch screen or the like. The touch screen includes a substrate and a touch layer on the substrate. Taking the capacitive touch screen as an example, the touch layer includes a plurality of scanning lines and multiple sensing lines crossed with each other. At the intersection of the scanning lines and the sensing lines, an insulating layer is disposed.

A flat panel image sensor is further provided according to an embodiment of the present invention, including the flat panel device containing the TFT array substrate according to the above-mentioned embodiment. In the pixel regions of the TFT array substrate, the photosensitive sensors are disposed.

An AMOLED is further provided according to an embodiment of the present invention, including the flat panel device containing the TFT array substrate according to the above-mentioned embodiment. In the pixel regions of the TFT array substrate, organic light-emitting diodes are disposed.

A liquid crystal display is further provided according to an embodiment of the present invention, including: the flat panel device containing the TFT array substrate according to the above-mentioned embodiment, a color film substrate, and a liquid crystal layer. In the pixel regions of the TFT array substrate, the pixel electrodes are disposed; the color film substrate and the TFT array substrate are disposed opposite to each other, with the liquid crystal layer filling between the color film substrate and the TFT array substrate.

An electronic paper display is further provided according to an embodiment of the present invention, including: the flat panel device containing the TFT array substrate according to the above-mentioned embodiment, an upper substrate and a microcapsule layer. In the pixel regions of the TFT array substrate, the pixel electrodes are disposed; the upper substrate and the TFT array substrate are disposed opposite to each other, with the microcapsule layer filling between the upper substrate and the TFT array substrate.

A touch apparatus is further provided according to an embodiment of the present invention, including the flat panel device according to the above-mentioned embodiment, in which a touch screen serves as the substrate unit.

Although the present invention is disclosed by way of preferred embodiments as described above, the present invention is not limited thereto. Various variations and changes may be made by a person skilled in the art without departing from the spirit and scope of the present invention. Therefore, the scope of the present invention is determined by the following claims.

What is claimed is:
1. A flat panel device, comprising:
   a substrate unit;
   a printed circuit board with a printed circuit board wire;
   a chip unit electrically connected to and disposed on the printed circuit board;
   a first flexible connection unit connected to the substrate unit with a first wire and not packaged with an integrated circuit;

a rigid connection unit connecting to the first flexible connection unit via the first wire, the rigid connection unit further comprises a rigid substrate having a surface;

a second flexible connection unit connected to the rigid connection unit via a second wire, and not packaged with an integrated circuit;

wherein the printed circuit board is connected to the second flexible connection unit with the printed circuit board wire, wherein the chip unit is electrically connected to the second wire, wherein the first wire further comprises a first conductive contact terminal disposed on one end and a second conductive contact terminal disposed on the other end, wherein the first conductive contact terminal is configured to connect to the substrate unit by anisotropic conductive film bonding or metal-welding, and wherein the second conductive contact terminal and a third conductive contact terminal are connected by anisotropic conductive film bonding or metal-welding;

wherein the rigid connection unit wire further comprises the third conductive contact terminal disposed on one end of the rigid connection unit wire and a fourth conductive contact terminal disposed on the other end of the rigid connection unit wire, wherein the rigid connection unit wire, the third conductive contact terminal and the fourth conductive contact terminal are disposed on the surface of the rigid substrate;

wherein the second flexible connection unit has a second wire on its surface extending from a fifth end to a sixth end of the second flexible connection unit, and wherein the second wire comprises a fifth conductive contact terminal disposed on one end of the second wire and a sixth conductive contact terminal disposed on the other end of the second wire, and wherein the fourth conductive contact terminal and the fifth conductive contact terminal are connected by anisotropic conductive film bonding or metal-welding, and wherein the sixth conductive contact terminal is configured to connect to a seventh conductive contact terminal of the printed circuit board by anisotropic conductive film bonding or metal-welding;

wherein the printed circuit board wire has the seventh conductive contact terminal and an eighth conductive contact terminal, disposed at the two ends of the printed circuit board wire respectively, and the eighth conductive contact terminal of the printed circuit board is connected to a chip conductive contact terminal of the chip unit by anisotropic conductive film bonding.

2. A flat panel device as in claim 1, wherein the printed circuit board is disposed along two edges of the substrate unit.

* * * * *